(12) United States Patent
Satoh et al.

(10) Patent No.: US 10,811,191 B2
(45) Date of Patent: Oct. 20, 2020

(54) ELECTRONIC COMPONENT

(71) Applicant: TDK CORPORATION, Tokyo (JP)

(72) Inventors: Fumiaki Satoh, Tokyo (JP); Toru Onoue, Tokyo (JP); Takuto Okamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 20 days.

(21) Appl. No.: 16/115,890

(22) Filed: Aug. 29, 2018

(65) Prior Publication Data

US 2019/0066925 A1  Feb. 28, 2019

(30) Foreign Application Priority Data

Aug. 31, 2017 (JP) ................................. 2017-166941

(51) Int. Cl.
| | |
|---|---|
| *H01G 4/248* | (2006.01) |
| *H01G 4/232* | (2006.01) |
| *H01G 4/012* | (2006.01) |
| *H01G 4/30* | (2006.01) |
| *H05K 3/34* | (2006.01) |
| *H05K 1/18* | (2006.01) |

(52) U.S. Cl.
CPC ............ *H01G 4/248* (2013.01); *H01G 4/012* (2013.01); *H01G 4/232* (2013.01); *H01G 4/30* (2013.01); *H05K 3/3442* (2013.01); *H05K 1/181* (2013.01); *H05K 3/3426* (2013.01); *H05K 2201/10015* (2013.01)

(58) Field of Classification Search
CPC .......... H01G 4/248; H01G 4/30; H01G 4/012; H01G 4/232; H01G 4/228; H05K 3/3442; H05K 3/3426; H05K 1/181
See application file for complete search history.

(56) References Cited

U.S. PATENT DOCUMENTS

| | | | | |
|---|---|---|---|---|
| 7,646,586 | B2* | 1/2010 | Togashi | H01G 4/2325 29/25.42 |
| 9,111,682 | B2* | 8/2015 | Sawada | H01G 4/30 |
| 9,460,853 | B2* | 10/2016 | Okamoto | H01G 4/30 |
| 10,074,482 | B2* | 9/2018 | Sasaki | H01G 4/232 |
| 10,115,523 | B2* | 10/2018 | Akiyoshi | H01G 4/232 |

(Continued)

FOREIGN PATENT DOCUMENTS

| | | |
|---|---|---|
| CN | 106971846 A | 7/2017 |
| JP | H09-148174 A | 6/1997 |

(Continued)

*Primary Examiner* — Nathan Milakovich
(74) *Attorney, Agent, or Firm* — Oliff PLC

(57) ABSTRACT

An element body of a rectangular parallelepiped shape has a length in a height direction larger than a length in a width direction and has a length in a longitudinal direction larger than the length in the height direction. A terminal electrode is disposed at an end of the element body in the width direction and extends in the longitudinal direction. The element body includes a pair of principle surfaces opposing each other in the height direction, a pair of end surfaces opposing each other in the longitudinal direction, and a pair of side surfaces opposing each other in the width direction. The terminal electrode includes a conductor disposed on the side surface. The conductor includes a protrusion having a length in the longitudinal direction larger than a length in the height direction.

7 Claims, 6 Drawing Sheets

(56) References Cited

U.S. PATENT DOCUMENTS

| | | | |
|---|---|---|---|
| 10,535,467 B2 * | 1/2020 | Sasaki | H01G 4/1227 |
| 2017/0098506 A1 * | 4/2017 | Ando | H01G 4/232 |
| 2017/0250027 A1 * | 8/2017 | Kowase | H01G 4/005 |
| 2017/0294268 A1 * | 10/2017 | Katsuta | H01G 4/012 |
| 2018/0082793 A1 * | 3/2018 | Satoh | H01G 4/005 |
| 2018/0182552 A1 * | 6/2018 | Sawada | H01G 4/248 |
| 2018/0190435 A1 * | 7/2018 | Kishi | H01G 4/0085 |
| 2019/0066926 A1 * | 2/2019 | Onoue | H01G 4/12 |
| 2019/0148070 A1 * | 5/2019 | Kobayashi | H05K 3/3442 |
| | | | 174/260 |

FOREIGN PATENT DOCUMENTS

| | | | | |
|---|---|---|---|---|
| JP | 10022164 A | * | 1/1998 | H01G 4/232 |
| JP | 2002025850 A | * | 1/2002 | |
| JP | 2007134398 A | * | 5/2007 | |
| JP | 2009239094 A | * | 10/2009 | |

* cited by examiner

ELECTRONIC COMPONENT

BACKGROUND OF THE INVENTION

1. Field of the Invention

The present invention relates to an electric component.

2. Description of Related Art

Known electronic components include an element body of a rectangular parallelepiped shape and a pair of external electrodes (see, for example, Japanese Unexamined Patent Publication No. H9-148174). The element body has a length in a width direction larger than a length in a height direction and has a length in a longitudinal direction larger than the length in the width direction. The pair of external electrodes is disposed at both ends of the element body in the width direction and extends in the longitudinal direction. The element body includes a pair of principle surfaces opposing each other in the height direction, a pair of end surfaces opposing each other in the longitudinal direction, and a pair of side surfaces opposing each other in the width direction. Each of the external electrodes includes a conductor located on the side surface.

SUMMARY OF THE INVENTION

The electronic component is mounted in a state in which the principle surface opposes an electronic device. Examples of the electronic device include a circuit board and an electronic component. The electronic device includes a pair of lands corresponding to the pair of terminal electrodes. Each of the terminal electrodes is electrically and physically connected to a corresponding land via solder. A length of the element body in the longitudinal direction is longer than a length in the width direction. The terminal electrodes extend in the longitudinal direction of the element body. In a case in which the electronic component is mounted on the electronic device, the electronic device needs to lands having a large area, as compared with in a case in which an electronic component in which the terminal electrodes extend in the width direction of the element body is mounted on the electronic device. The lands having a large area require a larger amount of solder to connect the terminal electrodes and the lands. A large amount of solder often leads to wetting of the solder over the conductor. Wetting of the solder may cause tombstoning. Tombstoning is a phenomenon in which electronic components rise during solder-mounting.

For example, electronic components for automobiles are required to cope with high power circuits specific to automobiles. Large capacity electronic components, therefore, may be required.

An object of one aspect of the present invention is to provide an electronic component that is able to cope with large capacity and suppresses wetting of solder.

An electronic component according to one aspect includes an element body of a rectangular parallelepiped shape and a pair of terminal electrodes. The element body shape has a length in a height direction larger than a length in a width direction and has a length in a longitudinal direction larger than the length in the height direction. The pair of terminal electrodes is disposed at both ends of the element body in the width direction and extends in the longitudinal direction. The element body includes a pair of principle surfaces opposing each other in the height direction, a pair of end surfaces opposing each other in the longitudinal direction, and a pair of side surfaces opposing each other in the width direction. Each of the terminal electrodes includes a conductor disposed on the side surface. The conductor includes a protrusion having a length in the longitudinal direction larger than a length in the height direction.

In the one aspect, the conductor includes the protrusion. The solder needs to pass over the protrusion in order for the solder to wets over the conductor. In the one aspect, the distance at which the solder wets over the conductor is long, as compared with an electronic component in which the conductor includes no protrusion. Therefore, the solder tends not to wet over the conductor.

An element body having a length in a height direction larger than a length in a width direction is able to include a larger number of internal electrodes stacked in the height direction, in the element body, as compared with an element body having a length in the height direction smaller than a length in the width direction. Therefore, the one aspect is able to cope with large capacity.

Consequently, the one aspect is able to cope with large capacity and suppresses wetting of the solder.

In the one aspect, the protrusion may be located at an approximate center of the conductor when viewed from the width direction.

In a configuration in which the protrusion is located at the approximate center of the conductor when viewed from the width direction, the solder tends not to wet beyond the approximate center of the conductor, but tends to wet over a region deviated from the approximate center of the conductor. Therefore, this configuration ensures a bonding strength by soldering between the terminal electrode and the electronic device. Consequently, this configuration suppresses wetting of the solder, and ensures the bonding strength by soldering.

In the one aspect, the conductor may include a first end region, a second end region, and a center region. In this case, the first end region is located closer to one end surface of the pair of end surfaces in the longitudinal direction. The second end region is located closer to another end surface of the pair of end surfaces in the longitudinal direction. The center region is located between the first end region and the second end region in the longitudinal direction. In a cross-section of the conductor taken along a plane that is parallel to the principle surface and is located closer to the principle surface than the protrusion in the height direction, a thickness of the center region may be greater than a thickness of each of the first and second end regions.

In a configuration in which the thickness of the center region is larger than the thickness of each of the first and second end regions in the above-mentioned cross-section, the distance until the solder reaches the protrusion is long. Therefore, this configuration suppresses wetting of the solder in the center region. Since the thickness of each of the first and second end regions is smaller than the thickness of the center region in the above-mentioned cross-section, the solder tend to wet in the first and second end regions. Therefore, this configuration ensures a bonding strength by soldering between the first and second end regions and the electronic device. Consequently, the present configuration suppresses wetting of the solder in the center region and ensures the bonding strength by soldering at the first and second end regions.

In the one aspect, a ratio of the length of the protrusion in the longitudinal direction to a length in the longitudinal direction of the conductor may be from 0.1 to 0.7.

In a configuration in which the ratio is greater than or equal to 0.1, a length in the longitudinal direction of the region where the protrusion is located at the conductor does not become excessively small. Therefore, this configuration more reliably suppresses wetting of the solder. In a configuration in which the ratio is less than or equal to 0.7, the length of the region where the protrusion is located at the conductor in the longitudinal direction does not become excessively large. Therefore, this configuration reliably achieves wetting of the solder and further ensures the bonding strength by soldering.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
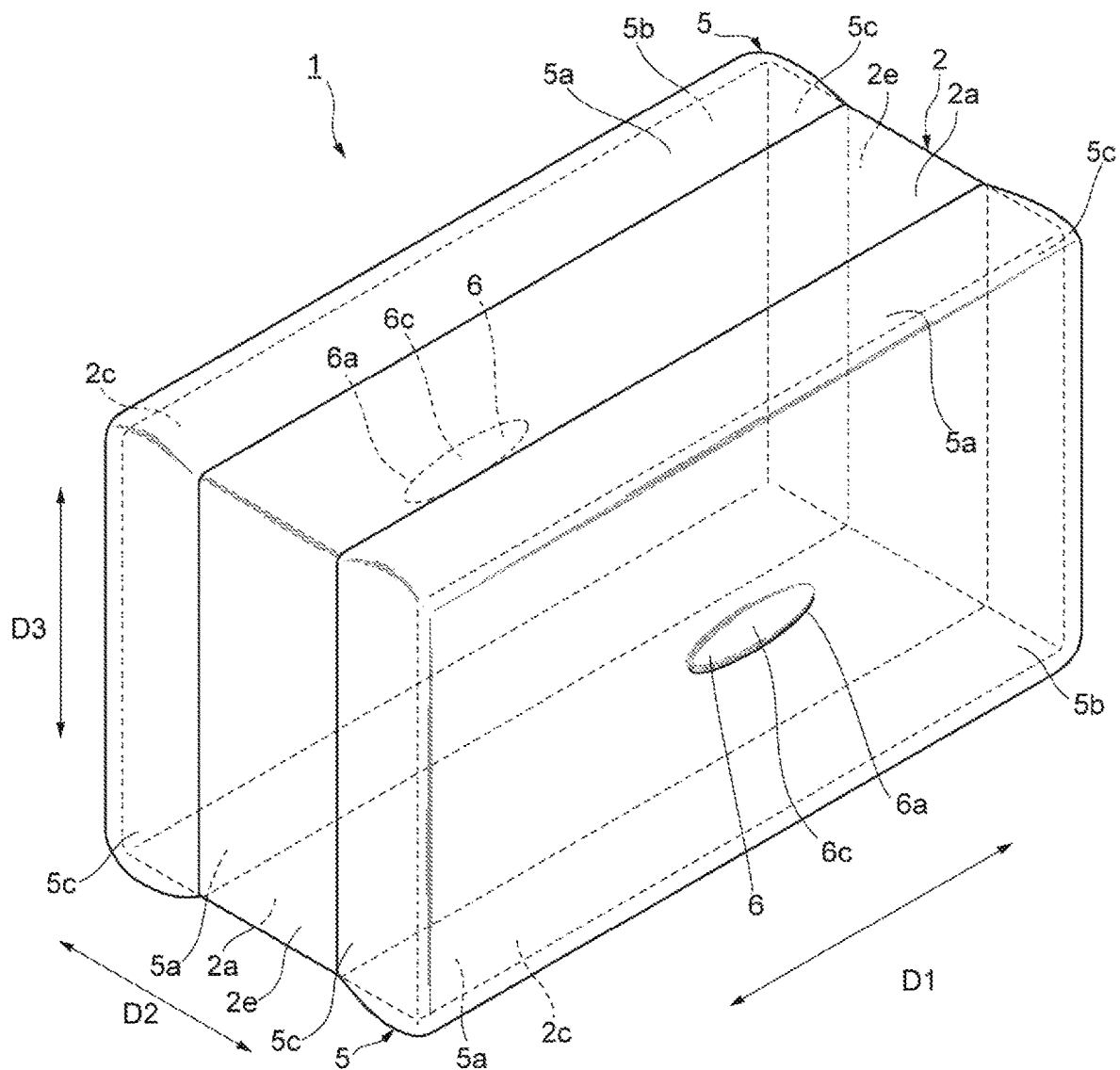
FIG. 1 is a perspective view of a multilayer capacitor according to an embodiment.

Hereinafter, embodiments of the present invention will be described in detail with reference to the accompanying drawings. In the following description, the same elements or elements having the same functions are denoted with the same reference numerals and overlapped explanation is omitted.

Figure 2:
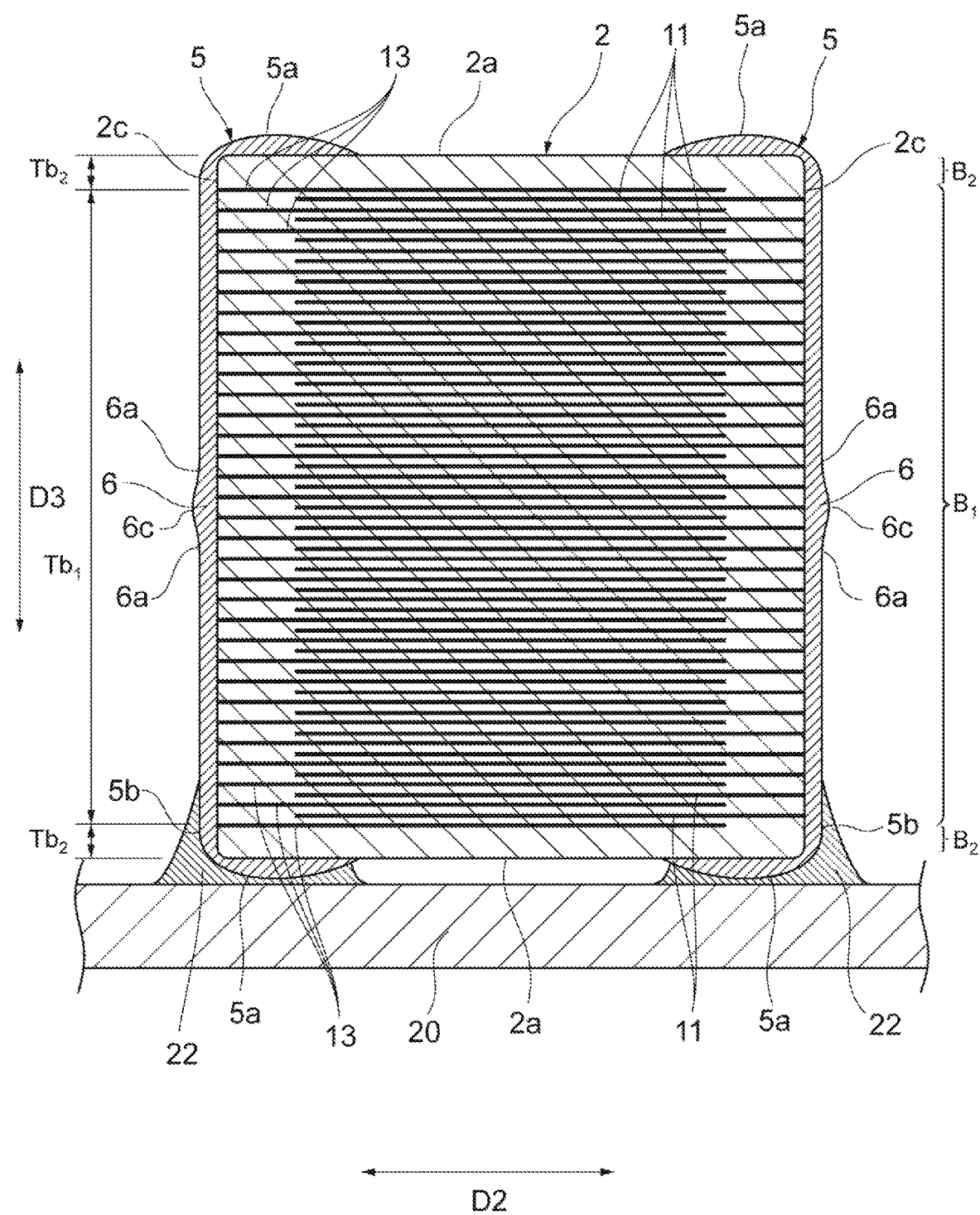
FIG. 2 is a view illustrating a cross-sectional configuration of the multilayer capacitor according to the embodiment.
Figure 3:
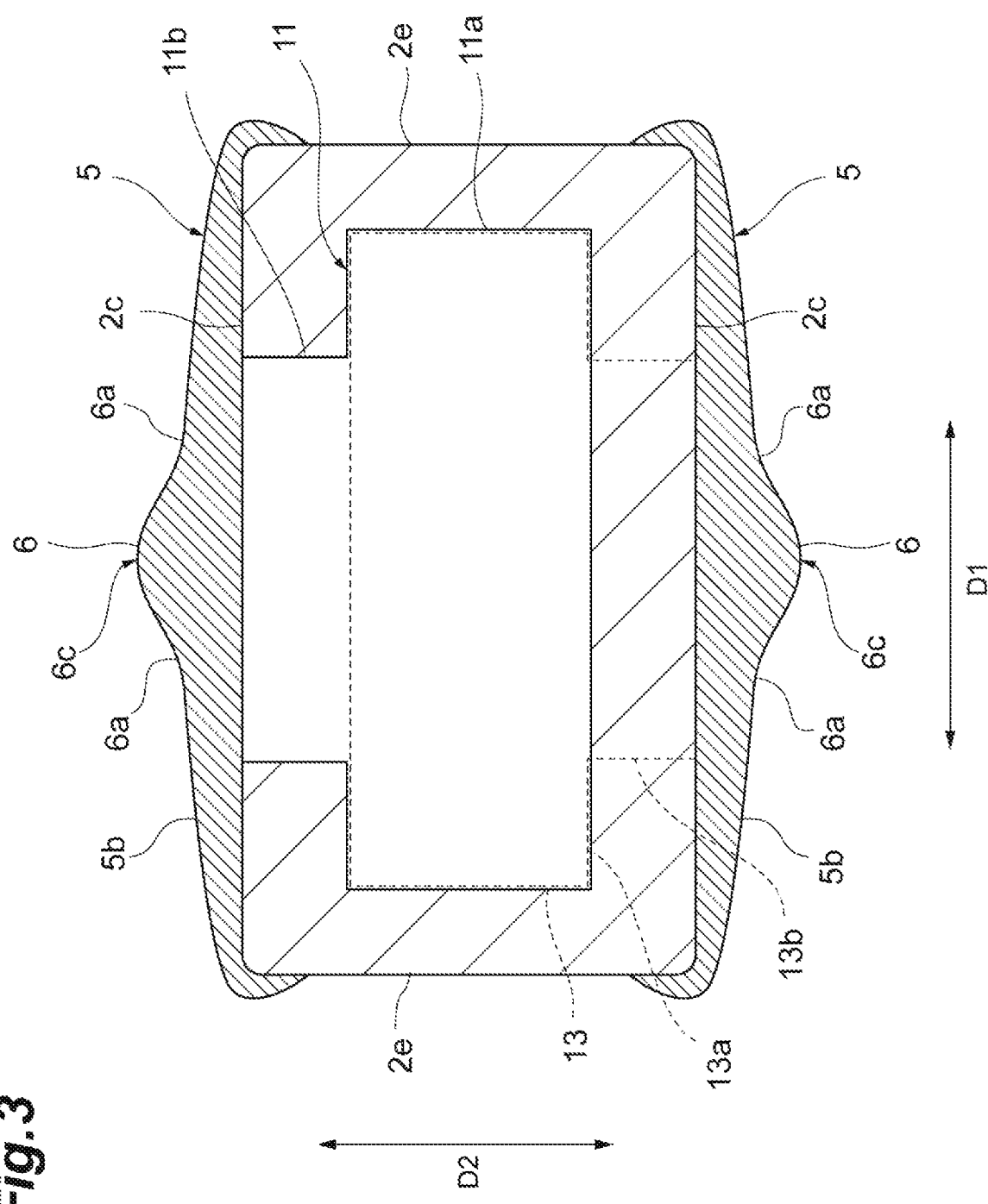
FIG. 3 is a view illustrating a cross-sectional configuration of the multilayer capacitor according to the embodiment.

A configuration of a multilayered capacitor 1 according to an embodiment will be described with reference to FIGS. 1 to 3. FIG. 1 is a perspective view of a multilayered capacitor of the embodiment. FIGS. 2 and 3 are views illustrating a cross-sectional configuration of the multilayer capacitor according to the embodiment. FIG. 2 is a cross-sectional view of the multilayered capacitor 1 taken along a plane that is parallel to a pair of end surfaces 2e that is described later and is located at approximately an equal distance from the pair of end surfaces 2e. FIG. 3 is a cross-sectional view of the multilayered capacitor 1 taken along a plane that is parallel to a pair of principal surfaces 2a that is described later and is located at approximately an equal distance from the pair of principal surfaces 2a. In the present embodiment, an electronic component is, for example, a multilayered capacitor 1.

As illustrated in FIGS. 1 to 3, the multilayered capacitor 1 includes an element body 2, a pair of terminal electrodes 5 disposed on an outer surface of the element body 2, and a plurality of internal electrodes 11 and 13 disposed inside the element body 2. The multilayered capacitor 1 is mounted on an electronic device 20 by soldering, as illustrated in FIG. 2. The electronic device 20 includes a circuit board or an electronic component, for example. The electronic device 20 includes a pair of pad electrodes (lands). The pad electrodes are not illustrated in FIG. 2. In a state in which the multilayered capacitor 1 is solder-mounted on the electronic device 20, a solder fillet 22 is formed between the terminal electrode 5 and the pad electrode that correspond to each other.

The element body 2 has a rectangular parallelepiped shape. The rectangular parallelepiped shape includes a rectangular parallelepiped shape in which corners and ridges are chamfered, and a rectangular parallelepiped shape in which the corners and ridges are rounded. The element body 2 has a length in a height direction D3 larger than a length in a width direction D2. The element body 2 has a length in a longitudinal direction D1 larger than the length in the height direction D3.

The element body 2 includes the pair of principle surfaces 2a, a pair of side surfaces 2c, and the pair of end surfaces 2e. The pair of principle surfaces 2a opposes each other in the height direction D3. The pair of side surfaces 2c opposes each other in the width direction D2. The pair of end surfaces 2e opposes each other in the longitudinal direction D1. In the multilayered capacitor 1, one principle surface 2a opposes the electronic device 20. The one principle surface 2a is arranged to constitute a mounting surface. The one principle surface 2a is the mounting surface.

The element body 2 is configured by laminating a plurality of dielectric layers in the height direction D3 in which the pair of principle surfaces 2a opposes each other. The element body 2 includes the plurality of laminated dielectric layers. In the element body 2, a lamination direction of the plurality of dielectric layers coincides with the height direction D3. For example, each of the dielectric layers includes a sintered body of a ceramic green sheet containing a dielectric material. Examples of the dielectric material include dielectric ceramics, such as $BaTiO_3$-, $Ba(Ti, Zr)O_3$-, or $(Ba, Ca)TiO_3$-based dielectric ceramics. In the actual element body 2, the dielectric layers are integrated to such an extent that boundaries between the dielectric layers cannot be visually recognized.

As illustrated in FIG. 1, the pair of terminal electrodes 5 is disposed at both ends of the element body 2 in the width direction D2. Each of the terminal electrodes 5 extends in the longitudinal direction D1. In the multilayered capacitor 1, the terminal electrodes 5 are provided along the side surfaces 2c of the element body 2. Providing the terminal electrodes 5 along the side surfaces 2c of the element body 2 makes the current path be short in the multilayered capacitor 1. Therefore, the multilayered capacitor 1 has a low equivalent series inductance (ESL).

The pair of terminal electrodes 5 is separated from each other and opposes each other in the width direction D2. Each of the terminal electrodes 5 includes a pair of conductors 5a, a conductor 5b, and a pair of conductors 5c. Each of the conductors 5a is disposed on the corresponding principle surface 2a. The conductor 5b is disposed on the side surface $2c$. Each of the conductors $5c$ is disposed on the corresponding end surface $2e$. The conductors $5a$, $5b$, and $5c$ are coupled to each other.

The internal electrodes 11 and 13 are disposed at different positions (layers) in the height direction D3 of the element body 2. The internal electrodes 11 and 13 are alternately disposed in the element body 2 to oppose each other in the height direction D3 with an interval therebetween. Polarities of the internal electrodes 11 and the internal electrodes 13 are different from each other.

Each of the internal electrodes 11 is exposed on one side surface $2c$ of the pair of side surfaces $2c$, but not exposed on the pair of principle surfaces $2a$ and the pair of end surfaces $2e$. Each of the internal electrodes 11 includes an end exposed at the one side surface $2c$. Each of the internal electrodes 11 is electrically and physically connected to one terminal electrode 5 at the one side surface $2c$. Each of the internal electrodes 11 is directly connected to the one terminal electrode 5.

Each of the internal electrodes 13 is exposed on another side surface $2c$ of the pair of side surfaces $2c$, but not exposed on the pair of principle surfaces $2a$ and the pair of end surfaces $2e$. Each of the internal electrodes 13 includes an end exposed at the other side surface $2c$. Each of the internal electrodes 13 is electrically and physically connected to another terminal electrode 5 at the other side surface $2c$. Each of the internal electrodes 13 is directly connected to the other terminal electrode 5.

The internal electrodes 11 and 13 both have a rectangular shape. The longitudinal direction D1 is a long side direction of each of the internal electrodes 11, 13. The width direction D2 is a short side direction of each of the internal electrodes 11, 13. Each of the internal electrodes 11 includes a main electrode portion $11a$ and a connecting portion $11b$. The main electrode portion $11a$ has a rectangular shape. The longitudinal direction D1 is a long side direction of the main electrode portion $11a$. The width direction D2 is a short side direction of the main electrode portion $11a$. The connecting portion $11b$ includes one end coupled to a long side of the main electrode portion $11a$ and another end exposed at the side surface $2c$. The main electrode portion $11a$ and the connecting portion $11b$ are integrally formed. Each of the internal electrodes 13 includes a main electrode portion $13a$ and a connecting portion $13b$. The main electrode portion $13a$ has a rectangular shape. The longitudinal direction D1 is a long side direction of the main electrode portion $13a$. The width direction D2 is a short side direction of the main electrode portion $13a$. The connecting portion $13b$ includes one end coupled to a long side of the main electrode portion $13a$ and another end exposed at the side surface $2c$. The main electrode portion $13a$ and the connecting portion $13b$ are integrally formed. The main electrode portion $11a$ and the main electrode portion $13a$ overlap each other when viewed in the height direction D3. For the sake of explanation, the outer edge of the main electrode portion $13a$ is shifted inside the outer edge of the main electrode portion $11a$ when viewed in the height direction D3 in FIG. 3. The outer edges of the main electrode portion $13a$ and $11a$ may completely overlap each other.

The internal electrodes 11 and 13 are made of a conductive material that is commonly used as an internal electrode of the multilayer electronic component. The conductive material includes, for example, base metal. The conductive material includes, for example, Ni or Cu. The internal electrodes 11 and 13 include a sintered body of conductive paste containing the conductive material described above.

As illustrated in FIG. 2, the element body 2 includes an inner layer portion $B_1$ and a pair of outer layer portions $B_2$. The internal electrodes 11 and 13 are disposed in the inner layer portion $B_1$. The inner layer portion $B_1$ is located between the pair of outer layer portions $B_2$ in the height direction D3. The internal electrodes 11 and 13 are not disposed in the outer layer portions $B_2$. A length $Tb_1$ of the inner layer portion $B_1$ in the height direction D3 is larger than a length $Tb_2$ of each of the outer layer portions $B_2$ in the height direction D3. Many internal electrodes 11 and 13 are stacked in the element body 2.

Figure 4:
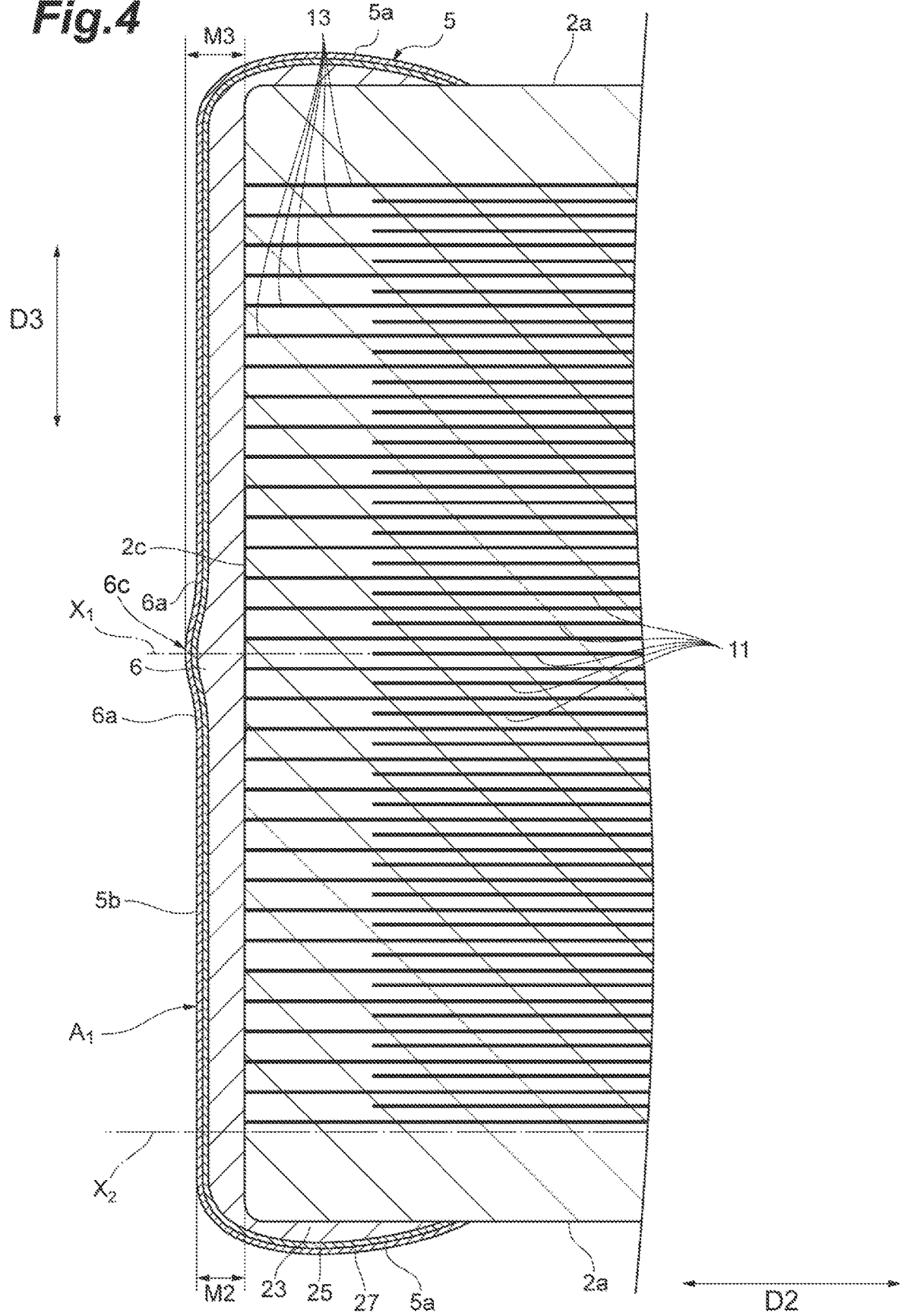
FIG. 4 is a view illustrating a cross-sectional configuration of the multilayer capacitor according to the embodiment.
Figure 5:
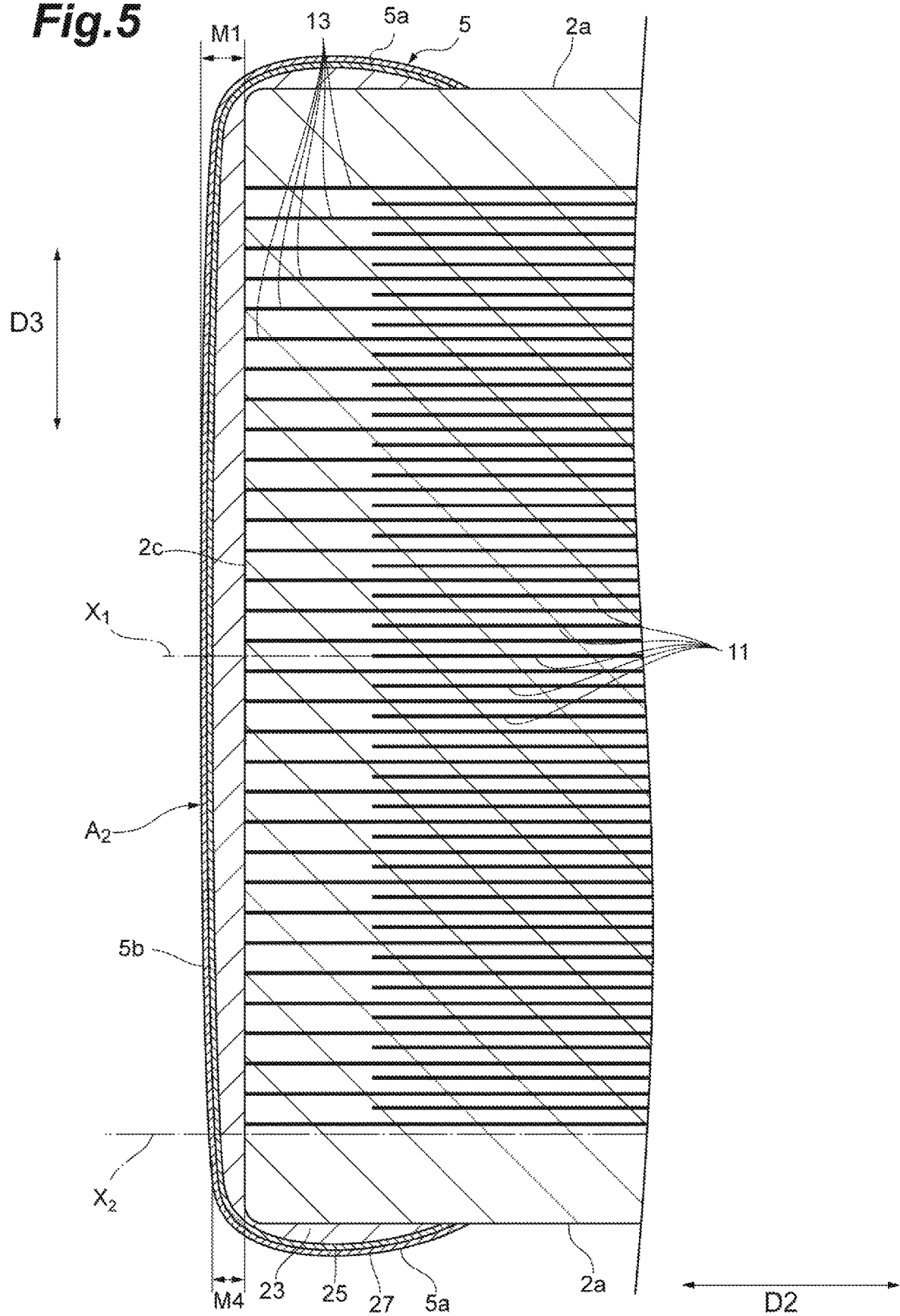
FIG. 5 is a view illustrating a cross-sectional configuration of the multilayer capacitor according to the embodiment.
Figure 6:
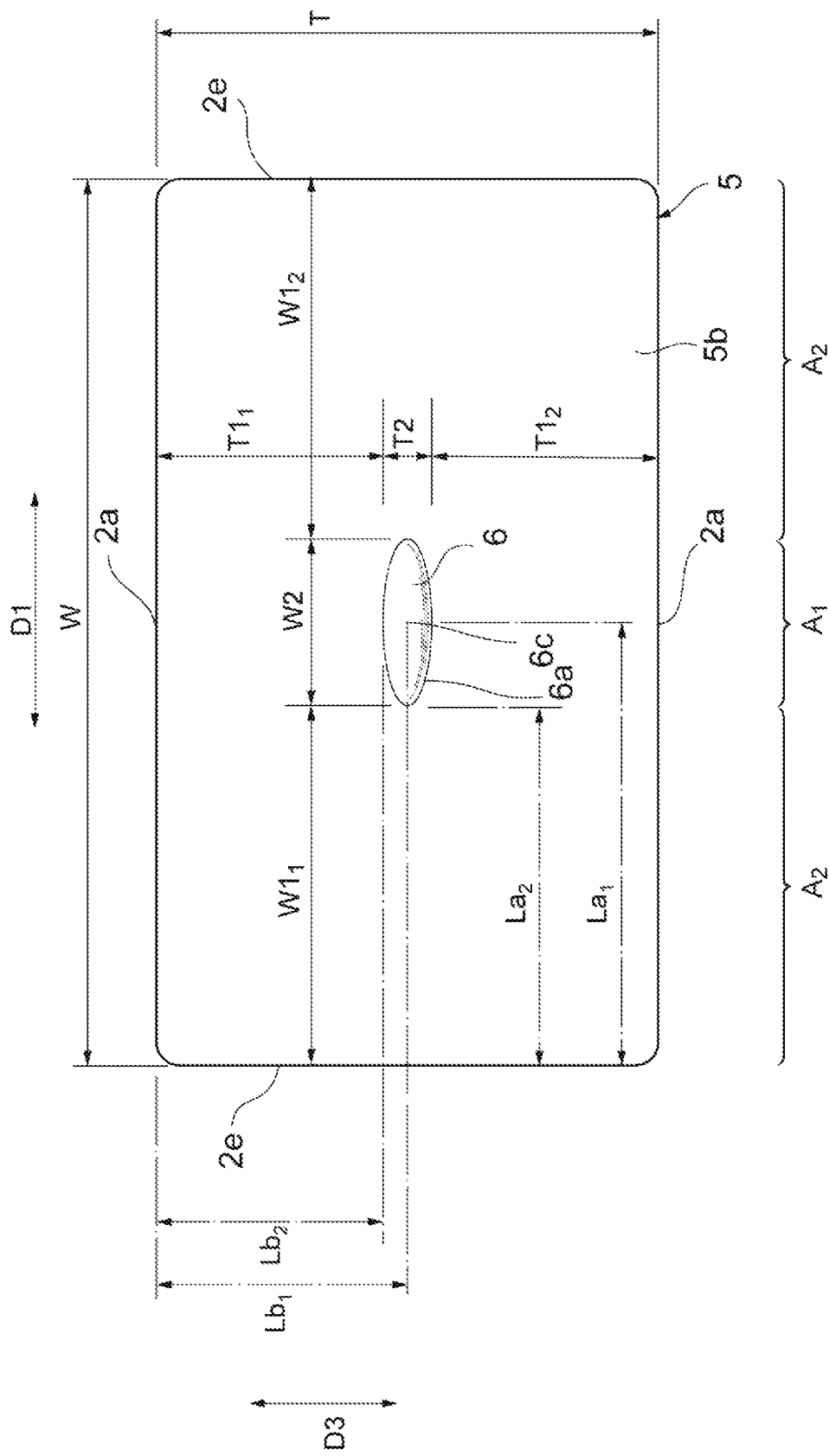
FIG. 6 is a side view of the multilayer capacitor according to the embodiment.

Next, a configuration of the terminal electrodes 5 will be described with reference to FIGS. 4 to 6. FIGS. 4 and 5 are views illustrating a cross-sectional configuration of the multilayered capacitor according to the embodiment. FIG. 6 is a side view of the multilayered capacitor according to the embodiment. FIG. 4 is a cross-sectional view of the multilayered capacitor 1 taken along a plane that is parallel to the pair of end surfaces $2e$ and is located at approximately an equal distance from the pair of end surfaces $2e$. FIG. 5 is a cross-sectional view of the multilayered capacitor 1 taken along a plane that is parallel to the pair of end surfaces $2e$ and is located closer to the end surface $2e$ than the protrusion 6 that is described later.

As illustrated in FIGS. 4 and 5, each of the terminal electrodes 5 includes an electrode layer 23, a first plating layer 25, and a second plating layer 27. The first plating layer 25 is formed on the electrode layer 23 by a plating method. The second plating layer 27 is formed on the first plating layer 25 by a plating method. The plating method includes, for example, an electroplating method. Each of the conductors $5a$, $5b$, and $5c$ includes the electrode layer 23, the first plating layer 25, and the second plating layer 27. The electrode layer 23 is an underlayer for forming a plating layer.

The electrode layer 23 is formed by sintering conductive paste applied onto the surface of the element body 2. The electrode layer 23 is formed by sintering a metal component (metal powder) included in the conductive paste. The electrode layer 23 is a sintered metal layer. In the present embodiment, the electrode layer 23 is a sintered metal layer made of Cu. The electrode layer 23 may be a sintered metal layer made of Ni. The conductive paste includes powder made of Cu or Ni, a glass component, an organic binder, and an organic solvent.

In the present embodiment, the first plating layer 25 is a Ni plating layer formed by Ni plating. The first plating layer 25 may be an Sn plating layer, a Cu plating layer, or an Au plating layer. The second plating layer 27 is an Sn plating layer formed by Sn plating. The second plating layer 27 may be a Cu plating layer or an Au plating layer.

Each of the conductors $5b$ covers an entirety of the corresponding side surface $2e$. The entirety of the side surface $2c$ represents an entire region surrounded by end edges of the pair of principle surfaces $2a$ and end edges of the pair of end surfaces $2e$. As illustrated in FIG. 1, each of the conductors $5a$ covers a part of the principle surface $2a$. The conductor $5a$ entirety covers a region of the principle surface $2a$ to a predetermined distance in the width direction D2 from the side surface $2c$. As illustrated in FIG. 1, the conductor $5c$ covers a part of the end surface $2e$. The conductor $5c$ entirety covers a region of the end surface $2e$ to a predetermined distance in the width direction D2 from the side surface $2c$.

A thickness of each of the conductors $5b$ in the width direction D2 gradually increases from an end of the conductor $5b$ toward an approximate center of the conductor $5b$.

In the present embodiment, the conductor 5b has the largest thickness in the width direction D2 at the center of the conductor 5b. The end of the conductor 5b is a portion where the conductor 5b is coupled to the conductors 5a and 5c. The center of the conductor 5b is equidistant from both end surfaces 2e of the conductor 5b in the longitudinal direction D1 and also equidistant from the principle surfaces 2a of the conductor 5b in the height direction D3.

A thickness increase rate of the conductor 5b in the width direction D2 changes near the center and near the end of the conductor 5b. Hereinafter, the "thickness increase rate of the conductor 5b in the width direction D2" is referred to as the "thickness increase rate of the conductor 5b". The thickness increase rate of the conductor 5b near the center of the conductor 5b is larger than the thickness increase rate near the ends of the conductor 51b. As used herein, the change of the thickness increase rate means that the thickness increase rate changes so as not to be regarded as substantially constant.

The thickness increase rate of the conductor 5b near the center of the conductor 5b is larger than the thickness increase rate of the conductor 5b near the ends of the conductor 5b. Therefore, each of the conductors 5b includes a protrusion 6. The protrusion 6 protrudes in a direction away from the element body 2 (side surface 2c). The protrusion 6 protrudes toward the center of the conductor 5b starting from a point at which the thickness increase rate of the conductor 5b changes. An outer edge 6a of the protrusion 6 is a position where the thickness increase rate of the conductor 5b changes. The protrusion 6 includes a peak 6c at the center of the conductor 5b. At the peak 6c, the conductor 5b has the largest thickness in the width direction D2.

As illustrated in FIG. 6, the protrusion 6 is located at the approximate center of the conductor 5b when viewed from the width direction D2. The approximate center of the conductor 5b represents, for example, that when viewed from the width direction D2, a distance $T1_1$ from one end of the external electrode 5 in the height direction D3 to the outer edge 6a and a distance $T1_2$ from another end of the external electrode 5 in the height direction D3 to the outer edge 6a are equivalent, and a distance $W1_1$ from one end of the external electrode 5 in the longitudinal direction D1 to the outer edge 6a a distance $W1_2$ from another end of the external electrode 5 in the longitudinal direction D1 to the outer edge 6a are equivalent. "Equivalent" does not necessarily only mean that values are consistent. Even if values include a slight difference in a predetermined range, manufacturing error, or measurement error, the values may be defined to be equal. For example, if the difference between the lengths $W1_1$ and $W1_2$ is not more than 5% of the length $W1_1$, the lengths $W1_1$ and $W1_2$ can be regarded as being equivalent. For example, if the difference between the lengths $T1_1$ and $T1_2$ is not more than 5% of the length $T1_1$, the lengths $T1_1$ and $T1_2$ can be regarded as being equivalent. Each length $W1_1$, $W1_2$ is also the shortest length in the longitudinal direction D1 from the end surface 2e to the protrusion 6. Each length $T1_1$, $T1_2$ is also the shortest length in the height direction D3 from the principle surface 2a to the protrusion 6.

The protrusion 6 has a length W2 in the longitudinal direction D1 larger than a length T2 in the height direction D3. In the present embodiment, the outer edge 6a of the protrusion 6 is in an elliptical shape in which the longitudinal direction D1 is the long axis direction. The elliptical shape also includes an oval shape. The length W2 of the protrusion 6 is the maximum length in the longitudinal direction D1 of the protrusion 6. The length T2 of the protrusion 6 is the maximum length in the height direction D3 of the protrusion 6.

The shortest distance $La_2$ from the end surface 2e to the outer edge 6a in the longitudinal direction D1 is, for example, about 3/10 to about 9/10 of the shortest distance $La^1$ from the end surface 2e to the peak 6c in the longitudinal direction D1. The shortest distance $Lb_2$ from the principle surface 2a to the outer edge 6a in the height direction D3 is, for example, about 3/10 to about 9/10 of the shortest distance $Lb_1$ from the principle surface 2a to the peak 6c in the height direction D3.

As illustrated in FIG. 6, the conductor 5b includes a pair of end regions $A_2$ and a center region $A_1$. Each of the end regions $A_2$ is located closer to the corresponding end surface 2e of the pair of end surfaces 2e, in the longitudinal direction D1. The center region $A_1$ is located between the pair of end regions $A_2$ in the longitudinal direction D1. The protrusion 6 is formed in the center region $A_1$. The center region $A_1$ includes the protrusion 6. The end regions $A_2$ are located closer to the end surfaces 2e than the protrusion 6 in the longitudinal direction D1. For example, when one end region $A_2$ constitutes a first end region, the other end region $A_2$ constitutes a second end region.

FIG. 4 illustrates the cross-section of the center region $A_1$. FIG. 5 illustrates a cross-section at the end region $A_2$. As illustrated in FIGS. 4 and 5, in the cross-section (e.g., cross-section along line $X_1$) of the conductor 5b taken along a plane that is parallel to the principle surfaces 2a and is located at approximately an equal distance from the principle surfaces 2a in the height direction D3, a thickness M1 of the center region $A_1$ is larger than a thickness M3 of the end region $A_2$. In the cross-section (e.g., cross-section along line $X_2$) of the conductor 5b taken along a plane that is parallel to the principle surface 2a and is located closer to the principle surface 2a than to the protrusion 6 in the height direction D3, a thickness M2 of the center region $A_1$ is larger than a thickness M4 of the end region $A_2$.

The thickness M1 is, for example, a thickness at an arbitrary position of the end region $A_2$ in the cross-section along the line $X_1$. The thickness M2 is, for example, a thickness at an arbitrary position in the center region $A_1$ in the cross section along the line $X_2$. The thickness M3 is, for example, a thickness at an arbitrary position in the center region $A_1$ in the cross-section along the line $X_1$. The thickness M4 is, for example, a thickness at an arbitrary position of the end region $A_2$ in the cross-section along the line $X_2$.

The thicknesses M1 to M4 may be average thicknesses obtained as follows. The thickness M1 is obtained, for example, by dividing the area of the end region $A_2$ in the cross-section along the line $X_1$ by the length of the end region $A_2$ in the longitudinal direction D1 in the cross-section along the line $X_1$. The thickness M2 is obtained, for example, by dividing the area of the center region $A_1$ in the cross-section along the line $X_2$ by the length of the center region $A_1$ in the longitudinal direction D1 in the cross-section along the line $X_2$. The thickness M3 is obtained, for example, by dividing the area of the center region $A_1$ in the cross-section along the line $X_1$ of the center region $A_1$ by the length in the longitudinal direction D1 in the cross-section along the line $X_1$. The thickness M4 is obtained, for example, by dividing the area of the end region $A_2$ in the cross-section along the line $X_2$ by the length of the end region $A_2$ in the longitudinal direction D1 in the cross-section along the line $X_2$.

A ratio [W2/W] of the length W2 of the protrusion 6 in the longitudinal direction D1 to a length W of the conductor 5b in the longitudinal direction D1 is, for example, from 0.1 to 0.7. A ratio [T2/T] of the length T2 of the protrusion 6 in the height direction D3 to a length T of the conductor 5b in the height direction D3 is, for example, from 0.1 to 0.7.

As described above, in the present embodiment, the conductor 5b includes the protrusion 6. The solder needs to pass over the protrusion 6 in order for the solder to wet over the conductor 5b. In the multilayered capacitor 1, the distance at which the solder wets over the conductor 5b is long, as compared with a configuration in which the conductor 5b includes no protrusion 6. Therefore, the solder tends not to wet over the conductor 5b.

The element body 2 having the length in the height direction D3 larger than the length in the width direction D2 is able to include a larger number of internal electrodes 11 and 13 stacked in the height direction D3, in the element body 2, as compared with another element body having the length in the height direction D3 smaller than the length in the width direction D2. Therefore, the multilayered capacitor 1 is able to cope with large capacity.

Consequently, the multilayered capacitor 1 is able to cope with large capacity and suppresses wetting of the solder. Suppressing the wetting of the solder prevents tombstoning of the multilayered capacitor 1.

In the multilayered capacitor 1, when viewed from the width direction D2, the protrusion 6 is located at the approximate center of the conductor 5b. The solder tends not to wet beyond the approximate center of the conductor 5b, but the solder tends to wet over a region deviated from the approximate center of the conductor 5b. Therefore, the multilayered capacitor 1 ensures a bonding strength by soldering between the terminal electrode 5 and the electronic device 20. Consequently, the multilayered capacitor 1 suppresses wetting of the solder, and ensures the bonding strength by soldering.

In the multilayered capacitor 1, the thickness of the center region $A_1$ is larger than the thickness of the end region $A_2$ in the cross section along the line $X_2$, so that the distance until the solder reaches the protrusion 6 is long. Therefore, the multilayered capacitor 1 suppresses wetting of the solder in the center region $A_1$. In the cross-section along the line $X_2$, the thickness of each of the end regions $A_2$ is smaller than the thickness of the center region $A_1$, so that the solder tends to wet on each of the end regions $A_2$. Therefore, the multilayered capacitor 1 ensures the bonding strength by the solder between the end regions $A_2$ and the electronic device 20. Consequently, the multilayered capacitor 1 suppresses wetting of the solder in the center region $A_1$ and ensures the bonding strength by the solder in each of the end regions $A_2$.

In the multilayered capacitor 1, since the ratio [W2/W] is greater than or equal to 0.1, the length in the longitudinal direction D1 of the region where the protrusion 6 is located at the conductor 5b is not too small. Therefore, the multilayered capacitor 1 reliably suppresses wetting of the solder. Since the ratio [W2/W] is less than or equal to than 0.7, the length in the longitudinal direction D1 of the region where the protrusion 6 is located at the conductor 5b is not too large. Therefore, the multilayered capacitor 1 reliably achieves wetting of the solder and further ensures the bonding strength by the solder.

In the multilayered capacitor 1, since the ratio [T2/T] is greater than or equal to 0.1, the length in the height direction D3 of the region where the protrusion 6 is located at the conductor 5b is not too small. Therefore, the multilayered capacitor 1 reliably suppresses wetting of the solder. Since the ratio [T2/T] is less than or equal to 0.7, the length in the height direction D3 of the region where the protrusion 6 is located at the conductor 5b is not too large. Therefore, the multilayered capacitor 1 reliably achieves wetting of the solder and further ensures the bonding strength by the solder.

Examples and comparative examples which are described later indicate that the present embodiment suppresses wetting of the solder. The present invention is not limited to the following Examples. Multilayered capacitors of Examples 1 to 3 have the same configuration as the multilayered capacitor 1 described above.

Table 1 illustrates the measurement results of the thickness of the conductor 5b measured for the multilayered capacitors of Examples 1 to 3 at a position apart from the first end of the element body 2 by a predetermined distance in the longitudinal direction D1, in the cross-section illustrated in FIG. 3. The cross-section illustrated in FIG. 3 is a cross-section taken along line $X_1$. The end surfaces 2e define the first ends of the element body 2. The position apart from the first end of the element body by the predetermined distance in the longitudinal direction D1 is included in a region from the end surface 2e to the center of the conductor 5b. Table 2 illustrates the measurement results of the thickness of the conductor 5b measured for the multilayered capacitors of Examples 1 to 3 at a position apart from the second end of the element body by a predetermined distance in the height direction D3, in the cross-section illustrated in FIG. 2. FIG. 2 illustrates the cross-section of the multilayered capacitor 1 taken along the plane that is parallel to the pair of end surfaces 2e and is located at approximately the equal distance from the pair of end surfaces 2e. The principle surfaces 2a define the second ends of the element body 2. The position apart from the second ends of the element body by the predetermined distance in the height direction D3 is included in a region from the principle surface 2a to the center of the conductor 5b.

TABLE 1

| Distance from End of Element Body | | 100 | 200 | 300 | 400 | 500 | 600 | 700 | 800 | 900 | 1025 |
|---|---|---|---|---|---|---|---|---|---|---|---|
| Total Thickness of Terminal Electrode [μm] | Example 1 | 11.3 | 20.7 | 25.8 | 36.0 | 39.0 | 45.5 | 51.0 | 55.0 | 70.8 | 80.0 |
| | Example 2 | 11.2 | 19.3 | 29.5 | 36.7 | 41.2 | 48.0 | 53.9 | 58.7 | 70.7 | 81.5 |
| | Example 3 | 12.6 | 23.9 | 31.0 | 38.2 | 47.0 | 54.0 | 58.0 | 61.0 | 75.0 | 86.1 |
| | ave | 11.7 | 21.3 | 28.8 | 37.0 | 42.4 | 49.2 | 54.3 | 58.2 | 72.2 | 82.5 |
| Ratio to Center | | 0.14 | 0.26 | 0.35 | 0.45 | 0.51 | 0.60 | 0.66 | 0.71 | 0.87 | 1.00 |

TABLE 2

| Distance from End of Element Body | | 100 | 200 | 300 | 400 | 500 | 630 |
|---|---|---|---|---|---|---|---|
| Total Thickness of Terminal Electrode [μm] | Example 1 | 19.8 | 30 | 44.3 | 53.8 | 65.7 | 83.9 |
| | Example 2 | 16.2 | 24.7 | 38.1 | 50.7 | 59.8 | 77.3 |
| | Example 3 | 18.8 | 33.8 | 47 | 55.3 | 65 | 85 |
| | ave | 18.3 | 29.5 | 43.1 | 53.3 | 63.5 | 82.1 |
| Ratio to Center | | 0.22 | 0.36 | 0.53 | 0.65 | 0.77 | 1.00 |

As illustrated in Table 1, in the Examples 1 to 3, the thickness increase rate of the conductor 5b was less than 0.1 in the region where the distance from the end surface 2e was from 100 μm to 800 μm. In this region, the thickness increase rate of the conductor 5b was approximately constant. The thickness increase rate of the conductor 5b largely exceeded 0.1 between a position distanced from the end surface 2e by 800 μm and a position distanced from the end surface 2e by 900 μm. The thickness increase rate of the conductor 5b in the region where the distance from the end surface 2e was from 800 μm to 1,025 μm was larger than the thickness increase rate of the conductor 5b in the region where the distance from the end surface 2e was from 100 μm to 800 μm. The position where the distance from the end surface 2e is 1,025 μm corresponds to the center of the conductor 5b.

As illustrated in Table 2, the thickness increase rate of the conductor 5b was less than 0.14 in the region where the distance from the principle surface 2a was from 100 μm to 500 μm in Examples 1 to 3. In this region, the thickness increase rate of the conductor 5b was approximately constant. The thickness increase rate of the conductor 5b between a position distanced from the principle surfaces 2a by 500 μm and a position distanced from the principle surfaces 2a by 630 μm largely exceeded 0.14. The thickness increase rate of the conductor 5b in the region where the distance from the principle surface 2a was from 500 μm to 630 μm was larger than the thickness increase rate of the conductor 5b in the region where the distance from the principle surface 2a was 100 μm to 500 μm. The position where the distance from the principle surface 2a was 630 μm corresponds to the center of the conductor 5b.

In the longitudinal direction D1, the thickness increase rate of the conductor 5b changed from the start position where the distance from the end surface 2e of the element body 2 was 800 μm. In the height direction D3, the thickness increase rate of the conductor 5b changed from the start position where the distance from the principle surface 2a of the element body 2 was 500 μm. Therefore, in the Examples 1 to 3, the protrusion 6 was located at the approximate center of the conductor 5b.

The position where the distance from the end surface 2e is 800 μm in the longitudinal direction D1 corresponds to the outer edge 6a of the protrusion 6. The position where the distance from the end surface 2e in the longitudinal direction D1 is 1,025 μm corresponds to the peak 6c of the protrusion 6. The shortest distance $La_2$ from the end surface 2e to the outer edge 6a in the longitudinal direction D1 is 800 μm. The shortest distance $La_1$ from the end surface 2e to the peak 6c in the longitudinal direction D1 is 1,025 μm. The shortest distance $La_2$ is about 4/5 of the shortest distance $La_1$.

The position where the distance from the principle surface 2a in the height direction D3 is 500 μm corresponds to the outer edge 6a of the protrusion 6. The position where the distance from the principle surface 2a in the height direction D3 is 630 μm corresponds to the peak 6c of the protrusion 6. The shortest distance $Lb_2$ from the principle surface 2a to the outer edge 6a in the height direction D3 is 500 μm. The shortest distance $Lb_1$ from the principle surface 2a to the peak 6c in the height direction D3 is 630 μm. The shortest distance $Lb_2$ is about 4/5 of the shortest distance $Lb_1$.

Table 3 illustrates the measurement results of the thickness of the conductor 5b at a position apart from the first end of the element body by a predetermined distance in the longitudinal direction D1, in the cross-section along line $X_2$. The end surface 2e defines the first end of the element body 2 as described above.

TABLE 3

| Distance from End of Element Body | | 100 | 200 | 300 | 400 | 500 | 600 | 700 | 800 | 900 | 1025 |
|---|---|---|---|---|---|---|---|---|---|---|---|
| Total Thickness of Terminal Electrode [μm] | Example 1 | 10.0 | 14.3 | 17.4 | 19.3 | 20.1 | 22.0 | 23.8 | 26.4 | 29.1 | 30.0 |
| | Example 2 | 10.9 | 14.5 | 17.3 | 17.7 | 18.0 | 19.0 | 22.0 | 23.3 | 24.5 | 27.5 |
| | Example 3 | 9.5 | 13.9 | 17.1 | 18.3 | 20.6 | 21.0 | 22.4 | 24.1 | 28.3 | 30.2 |
| | ave | 10.1 | 14.2 | 17.3 | 18.4 | 19.6 | 20.7 | 22.7 | 24.6 | 27.3 | 29.2 |
| Ratio to Center | | 0.35 | 0.49 | 0.59 | 0.63 | 0.67 | 0.71 | 0.78 | 0.84 | 0.93 | 1.00 |

As illustrated in Table 3, in Examples 1 to 3, the thickness of the conductor 5b was larger as it approached the center of the conductor 5b with reference to a position where the distance from the end surface 2e is 100 μm. In the cross-section along line $X_2$, a thickness M2 in the region where the distance from the end surface 2e was from 800 μm to 1,025 μm was larger than a thickness M4 in the region where the distance from the end surface 2e was from 100 μm to 800 μm. A region where the distance from the end surface 2e is from 800 μm to 1,025 μm corresponds to the center region $A_1$. A region where the distance from the end surface 2e is from 100 μm to 800 μm corresponds to the end region $A_2$.

Although the embodiments and modifications of the present invention have been described above, the present invention is not necessarily limited to the embodiments and modifications, and the embodiment can be variously changed without departing from the scope of the invention.

In the above-described embodiment, each of the terminal electrodes 5 includes the conductor 5a on each of the principle surface 2a. However, each of the terminal electrodes 5 may include the conductor 5a only on one principle surface 2a arranged to constitute a mounting surface.

In the present embodiment, the protrusion 6 is formed at the approximate center of the conductor 5b when viewed from the width direction D2, but the protrusion 6 may be located at a position deviated from the approximate center of the conductor 5b when viewed from the width direction D2. The lengths $T1_1$ and $T1_2$ may not be equivalent to each other. The lengths $W1_1$ and $W1_2$ may not be equivalent to each other. The shape of the outer edge 6a of the protrusion 6 is not limited to the elliptical shape. The outer edge 6a may have a rectangular shape, for example.

In the cross-section along the line $X_2$, the thickness of the center region $A_1$ and the thickness of the end region $A_2$ may be equivalent. In the cross-section along the line $X_2$, the thickness of the end region $A_2$ may be larger than the thickness of the center region $A_1$. However, as described above, the configuration in which the thickness of the center region $A_1$ is larger than the thickness of the end region $A_2$ in the cross-section along the line $X_2$ ensures the bonding strength by soldering in the end regions $A_2$, and suppresses the wetting of the solder in the center region $A_1$.

The ratio [W2/W] may be smaller than 0.1 or larger than 0.7. However, as described above, the configuration in which the ratio [W2/W] is from 0.1 to 0.7 reliably achieves wetting of the solder and further ensures the bonding strength by soldering.

The ratio [T2/T] may be smaller than 0.1 or larger than 0.7. However, the configuration in which the ratio [T2/T] is from 0.1 to 0.7 reliably achieves wetting of the solder and further ensures the bonding strength by soldering.

The electronic component of the present embodiment is a multilayer capacitor 1. Applicable electronic components are not limited to multilayer capacitors. Examples of the applicable electronic components include, but not limited to, multilayer electronic components such as a multilayer inductor, a multilayer varistor, a multilayer piezoelectric actuator, a multilayer thermistor, or a multilayer electronic component, and electronic components other than the multilayer electronic components.

What is claimed is:

1. An electronic component, comprising:
   an element body of a rectangular parallelepiped shape, having a length in a height direction larger than a length in a width direction and having a length in a longitudinal direction larger than the length in the height direction; and
   a pair of terminal electrodes disposed at both ends of the element body in the width direction and extending in the longitudinal direction, each terminal electrode including a sintered metal layer being in direct contact with the element body and a plating layer being in direct contact with the sintered metal layer, wherein
   the element body includes a pair of principle surfaces opposing each other in the height direction, a pair of end surfaces opposing each other in the longitudinal direction, and a pair of side surfaces opposing each other in the width direction,
   each of the terminal electrodes includes a corresponding conductor disposed on a corresponding one of the side surfaces, each conductor including the sintered metal layer and the plating layer,
   each conductor includes a corresponding protrusion having a length in the longitudinal direction larger than a length in the height direction, and
   each sintered metal layer has a corresponding thickness that increases at the corresponding protrusion.

2. The electronic component according to claim 1, wherein
   each protrusion is located at an approximate center of the corresponding conductor when viewed from the width direction.

3. The electronic component according to claim 1, wherein
   an outer edge of the corresponding protrusion is defined by a position where a thickness increase rate of the corresponding conductor changes, and
   each conductor includes
   a first end region located closer to one end surface of the pair of end surfaces in the longitudinal direction,
   a second end region located closer to another end surface of the pair of end surfaces in the longitudinal direction, and
   a center region located between the corresponding first end region and the corresponding second end region in the longitudinal direction, and
   wherein for each conductor, a thickness of the corresponding center region is larger than a thickness of each of the corresponding first and second end regions in a cross-section of the corresponding conductor that is taken along a plane parallel to the corresponding principle surface and that is located closer to the corresponding principle surface than the corresponding protrusion in the height direction.

4. The electronic component according to claim 1, wherein
   a ratio of the length of each protrusion in the longitudinal direction to a length of the corresponding conductor in the longitudinal direction is from 0.1 to 0.7.

5. The electronic component according to claim 1, wherein
   the thickness of each sintered metal layer gradually increases toward a corresponding maximum thickness position of the sintered metal layer, at the corresponding protrusion.

6. The electronic component according to claim 1, wherein
   a thickness of each protrusion gradually increases toward a maximum thickness position of the protrusion.

7. An electronic component, comprising:
   an element body of a rectangular parallelepiped shape, having a length in a height direction larger than a length in a width direction and having a length in a longitudinal direction larger than the length in the height direction; and
   a pair of terminal electrodes disposed at both ends of the element body in the width direction and extending in the longitudinal direction, wherein
   the element body includes a pair of principle surfaces opposing each other in the height direction, a pair of end surfaces opposing each other in the longitudinal direction, and a pair of side surfaces opposing each other in the width direction,
   each of the terminal electrodes includes a corresponding conductor disposed on a corresponding one of the side surfaces,
   each conductor includes a corresponding protrusion having a length in the longitudinal direction larger than a length in the height direction,
   an outer edge of the corresponding protrusion is defined by a position where a thickness increase rate of the corresponding conductor changes,
   each conductor includes
   a first end region located closer to one end surface of the pair of end surfaces in the longitudinal direction,
   a second end region located closer to another end surface of the pair of end surfaces in the longitudinal direction, and
   a center region located between the corresponding first end region and the corresponding second end region in the longitudinal direction, and wherein for each conductor, a thickness of the corresponding center region is larger than a thickness of each of the corresponding first and second end regions in a cross-section of the corresponding conductor that is taken along a plane parallel to the corresponding principle surface and that is located closer to the corresponding principle surface than the corresponding protrusion in the height direction.

\* \* \* \* \*